(12) United States Patent
Huang et al.

(10) Patent No.: US 8,288,224 B2
(45) Date of Patent: Oct. 16, 2012

(54) METHOD FOR MANUFACTURING CAPACITOR LOWER ELECTRODES OF SEMICONDUCTOR MEMORY

(75) Inventors: Shin-Bin Huang, Hsinchu County (TW); Tzung-Han Lee, Taipei (TW); Chung-Lin Huang, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 269 days.

(21) Appl. No.: 12/699,399

(22) Filed: Feb. 3, 2010

(65) Prior Publication Data

US 2011/0092044 A1 Apr. 21, 2011

(30) Foreign Application Priority Data

Oct. 21, 2009 (TW) .............................. 98135584 A

(51) Int. Cl.
*H01L 21/8242* (2006.01)

(52) U.S. Cl. ................. 438/241; 438/242; 257/E29.346

(58) Field of Classification Search .................. 438/241, 438/242; 257/E29.346
See application file for complete search history.

*Primary Examiner* — Bradley K Smith
*Assistant Examiner* — Amar Movva
(74) *Attorney, Agent, or Firm* — Rosenberg, Klein & Lee

(57) ABSTRACT

A method for manufacturing capacitor lower electrodes includes a dielectric layer, a first silicon nitride layer and a hard mask layer; partially etching the hard mask layer, the first silicon nitride layer and the dielectric layer to form a plurality of concave portions; depositing a second silicon nitride layer onto the hard mask layer and into the concave portions; partially etching the second silicon nitride layer, the hard mask layer and the dielectric layer to form a plurality of trenches; forming a capacitor lower electrode within each trench and partially etching the first silicon nitride layer, the second silicon nitride layer, the dielectric layer and the capacitor lower electrodes to form an etching area; and etching and removing the dielectric layer from the etching area, thereby a periphery of each capacitor lower electrode is surrounded and attached to by the second silicon nitride layer.

13 Claims, 7 Drawing Sheets

METHOD FOR MANUFACTURING CAPACITOR LOWER ELECTRODES OF SEMICONDUCTOR MEMORY

BACKGROUND OF THE INVENTION

1. Field of the Invention

The present invention relates to a method for manufacturing capacitor lower electrodes of a semiconductor memory, and more particularly to a method for manufacturing capacitor lower electrodes of a stack dynamic random access memory.

2. Description of Related Art

Dynamic random access memory is one kind of semiconductor memory. Each memory cell of a dynamic random access memory is composed of a field effect transistor and a capacitor, and a source or a drain of the field effect transistor is electrically connected with the capacitor. Capacitors can be categorized into stacked type capacitors and deep trench type capacitors, wherein the stacked type capacitors are directly formed over surfaces of semiconductor substrates containing field effect transistors and the deep trench type capacitors are formed in semiconductor substrates.

As shown in FIGS. 1-5, a conventional method for manufacturing capacitor lower electrodes of a semiconductor memory is provided. At first, the method includes fabricating a semiconductor substrate 1a which has a field effect transistor (not shown) and a plurality of conductive plugs 11a electrically connected with a source or a drain of the field effect transistor; secondly, forming a stacked structure 2a on an upper surface of the semiconductor substrate 1a, wherein the stacked structure 2a includes an insulating oxide layer 21a, a dielectric layer 22a and an insulating nitride layer 3a from bottom to top, and the insulating oxide layer 21a, the dielectric layer 22a and the insulating nitride layer 23a have different etching rates for acid. As shown in FIG. 2, after the stacked structure 2a is formed, adopting a yellow light technology to form a plurality of trenches 24a, so that the conductive plugs 11a are exposed in the trenches 24a. Then, forming a conductive metal material 25a and a capacitor lower electrode 26a of which the cross-section is in a U shape in each trench 24a. Thus, the conductive metal material 25a is contacted with the conductive plugs 11a and the capacitor lower electrodes 26a is located on the conductive metal material 25a. Then, the insulating nitride layer 23a and the capacitor lower electrodes 26a (as shown in FIG. 1 and FIG. 3, the step is called as Lattice etch) are partially etched to form an elliptic etching-area, and the dielectric layer 22a is etched and removed from the etching-area (as shown in FIG. 4).

To improve data storage capacity of memories, density of memory cells must be increased. The solution for solving the problem is to decrease dimensions in a semiconductor fabrication process or increase surface areas of the capacitor lower electrodes 26a. However, when dimensions are getting smaller, the semiconductor fabrication processing of the U-shaped capacitor lower electrodes 26a is getting more difficult. Whether the dimensions become smaller or the surface areas are increased causes that the supporting stress becomes lower. Consequently, it is very difficult to fabricate the dielectric layer and capacitor upper electrodes outside the capacitor lower electrodes 26a for preventing from collapsing or producing deformation.

Hence, the inventors of the present invention believe that the shortcomings described above are able to be improved and finally suggest the present invention which is of a reasonable design and is an effective improvement based on deep research and thought.

SUMMARY OF THE INVENTION

A main objective of the present invention is to provide a method for manufacturing capacitor lower electrodes of a semiconductor memory which can enhance supporting stress of the capacitor lower electrodes, reduce the difficulty in disposing of capacitor upper electrodes and capacitor dielectric layers outside the capacitor lower electrodes, and prevent the capacitor lower electrodes from collapsing or producing deformation.

To achieve the above-mentioned objective, a method for manufacturing capacitor lower electrodes of a semiconductor memory in accordance with the present invention is provided. The method includes the steps of:

forming a stacked structure over a semiconductor substrate with a plurality of conductive plugs;

partially etching a hard mask layer, a first silicon nitride layer and a dielectric layer in the stacked structure to form a plurality of concave portions;

depositing a second silicon nitride layer onto the hard mask layer and into the concave portions;

partially etching the second silicon nitride layer, the hard mask layer, the dielectric layer and an insulating nitride layer to form a plurality of trenches so that the conductive plugs are exposed in the trenches;

forming a capacitor lower electrode and a conductive metal material within each trench and partially etching the first silicon nitride layer, the second silicon nitride layer, the dielectric layer and the capacitor lower electrodes to form an etching area; and etching and removing the dielectric layer from the etching area, so that a periphery of each capacitor lower electrode is surrounded and attached to by the second silicon nitride layer for enhancing supporting stress of each capacitor lower electrode, reducing the difficulty in disposing of capacitor dielectric layers and capacitor upper electrodes outside the capacitor lower electrodes, and preventing the capacitor lower electrodes from collapsing or producing deformation.

The efficacy of the present invention is as follows: the periphery of each capacitor lower electrode is surrounded and attached to by the second silicon nitride layer deeper than the first silicon nitride layer, and the second silicon nitride layer has a larger surface area, thereby increasing the contact area between the second silicon nitride layer and the capacitor lower electrodes, enhancing the supporting stress of the capacitor lower electrodes, reducing the difficulty in disposing of capacitor dielectric layers and capacitor upper electrodes outside the capacitor lower electrodes, and effectively preventing the capacitor lower electrodes from collapsing or producing deformation.

DETAILED DESCRIPTION OF THE PREFERRED EMBODIMENTS

Figure 1:
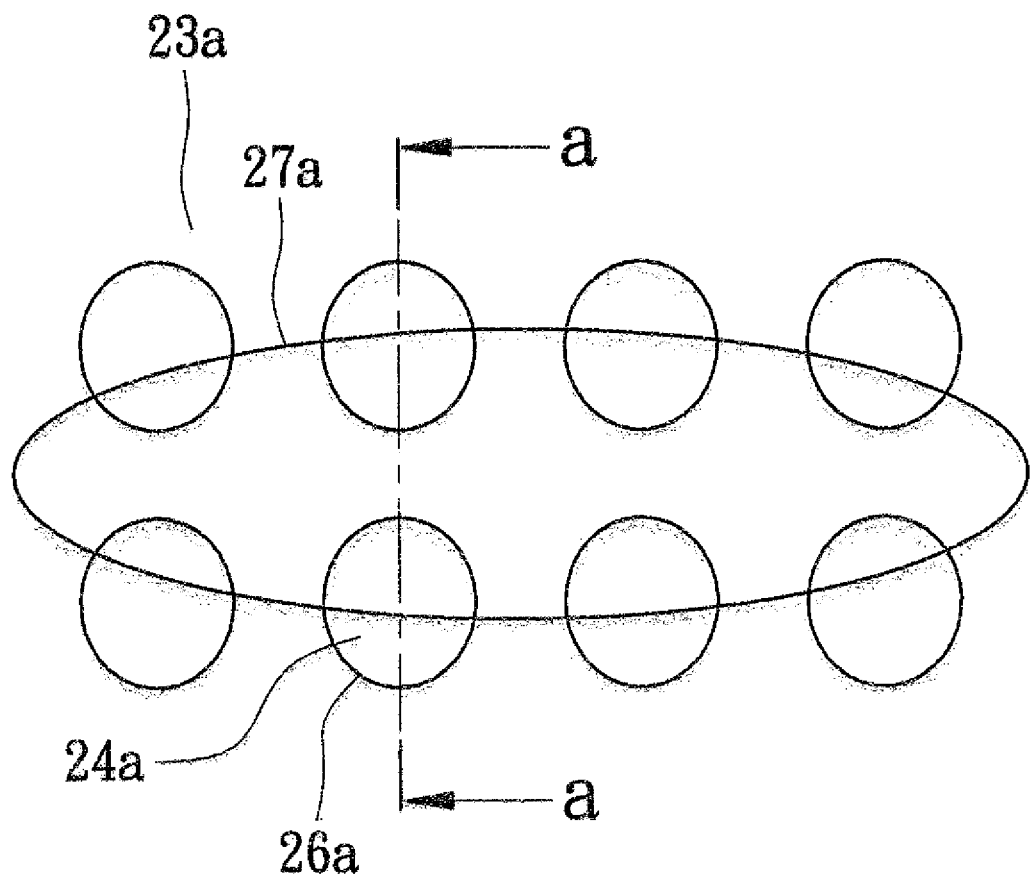
FIG. 1 is a partial top view of conventional capacitor lower electrodes of a semiconductor memory.
Figure 2:
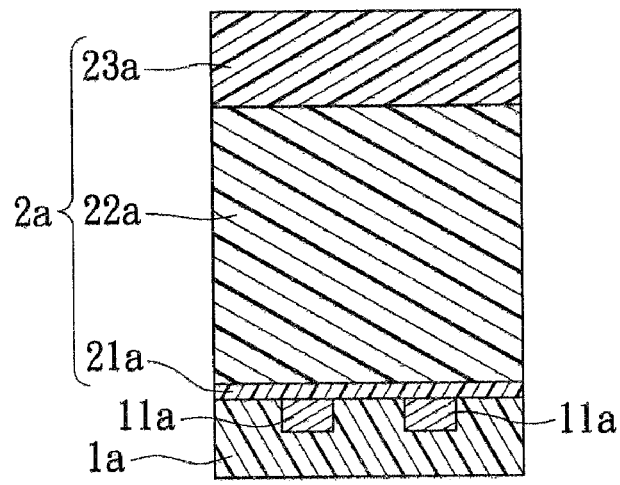
FIG. 2 is a first cross-sectional view taken along lines a-a of FIG. 1 in a process step.
Figure 3:
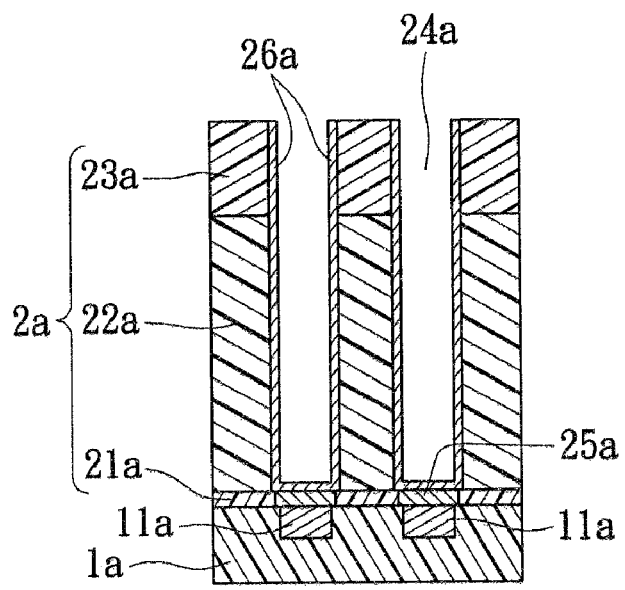
FIG. 3 is a second cross-sectional view taken along lines a-a of FIG. 1 in a process step.
Figure 4:
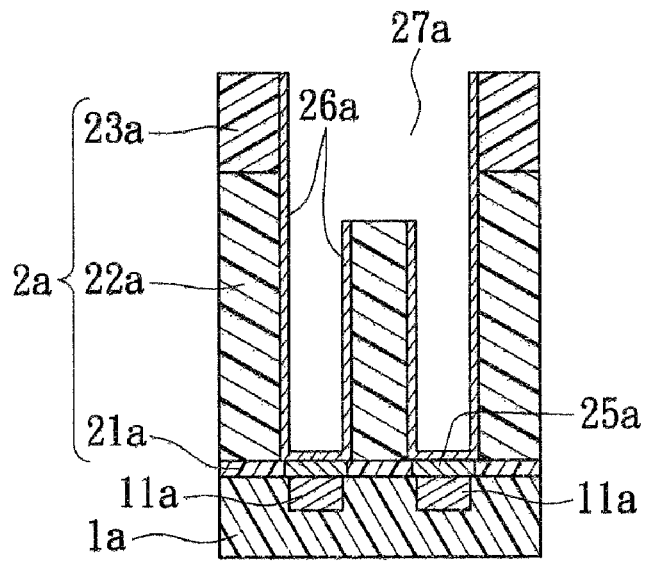
FIG. 4 is a third cross-sectional view taken along lines a-a of FIG. 1 in a process step.
Figure 5:
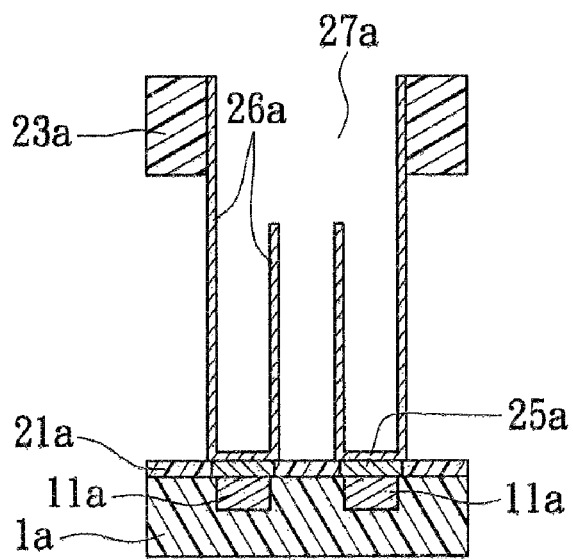
FIG. 5 is a fourth cross-sectional view taken along lines a-a of FIG. 1 in a process step.
Figure 6:
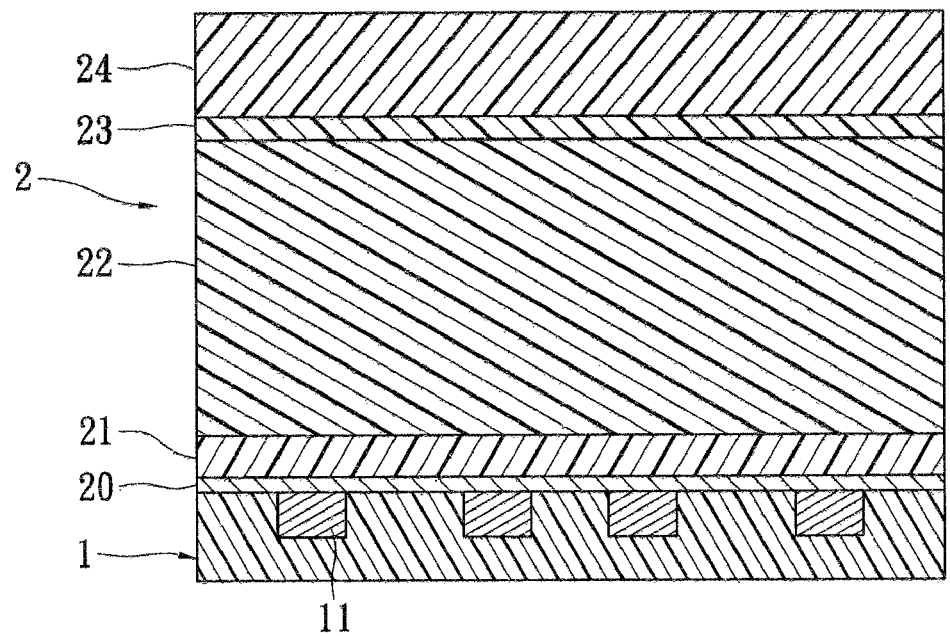
FIG. 6 is a first cross-sectional view showing a step of a method for manufacturing capacitor lower electrodes of a semiconductor memory of the present invention.

FIGS. 6-12 illustrate steps of a method for manufacturing capacitor lower electrodes of a semiconductor memory according to the present invention, wherein the semiconductor memory is a dynamic random access memory. The first process step is as follows: please refer to FIG. 6, at first, forming a stacked structure 2 over an upper surface of a semiconductor substrate 1 in which a plurality of conductive plugs 11 made of polysilicon and sources or drains (not shown) of field effect transistors electrically connected with the conductive plugs 11 are embedded.

The stacked structure 2 includes an insulating nitride layer 20, at least one dielectric layer, a first silicon nitride (SiN) layer 23 and a hard mask layer 24. In the embodiment, a dielectric layer 21 composed of USG (undoped silicate glass) and a dielectric layer 22 composed of PSG (phosphosilicate glass) are stacked on the insulating nitride layer 20 successively and interposed between the insulating nitride layer 20 and the first silicon nitride layer 23. The hard mask layer 24 is composed of silicon dioxide or silicon nitride and stacked on the first silicon nitride layer 23.

Figure 7:
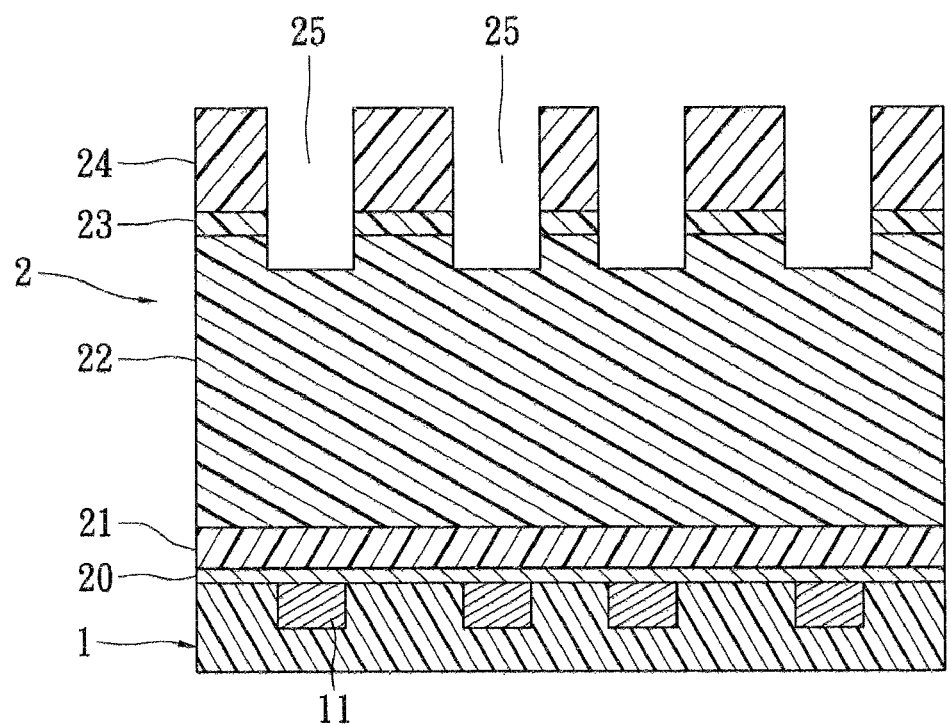
FIG. 7 is a second cross-sectional view showing a step of the method for manufacturing capacitor lower electrodes of a semiconductor memory of the present invention.

Please refer to FIG. 7, the second process step is as follows: partially etching the hard mask layer 24, the first silicon nitride layer 23 and the dielectric layer 22 to form a plurality of spaced concave portions 25 which are cylindrical. The depth of the concave portions 25 may be controlled to be greater than that of the first silicon nitride layer 23 basing on the etching duration. A yellow light technology (42 photo) may be adopted to determine the positions of the concave portions 25 in the hard mask layer 24, and then a plasma dry etching technology may be adopted to etch the layers to form the concave portions 25.

Figure 8:
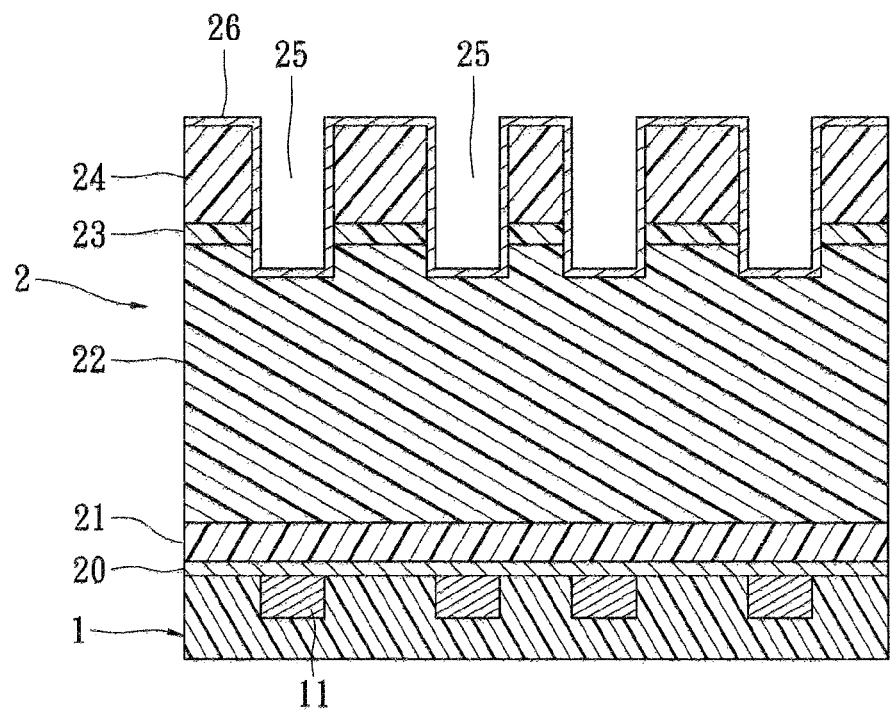
FIG. 8 is a third cross-sectional view showing a step of the method for manufacturing capacitor lower electrodes of a semiconductor memory of the present invention.

Please refer to FIG. 8, the third process step is as follows; depositing a second silicon nitride layer 26 onto the top surface of the hard mask layer 24 and within the concave portions 25.

Figure 9:
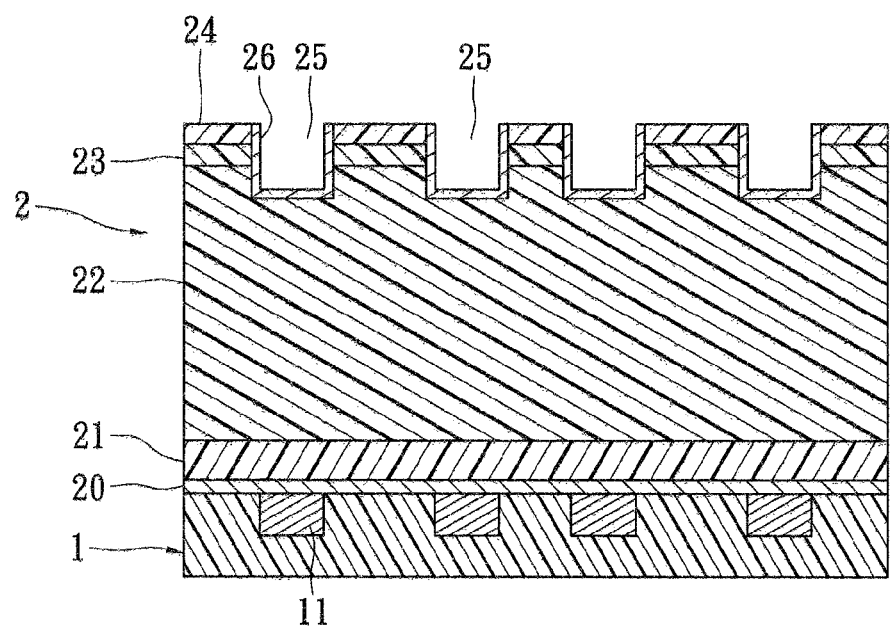
FIG. 9 is a fourth cross-sectional view showing a step of the method for manufacturing capacitor lower electrodes of a semiconductor memory of the present invention.
Figure 10:
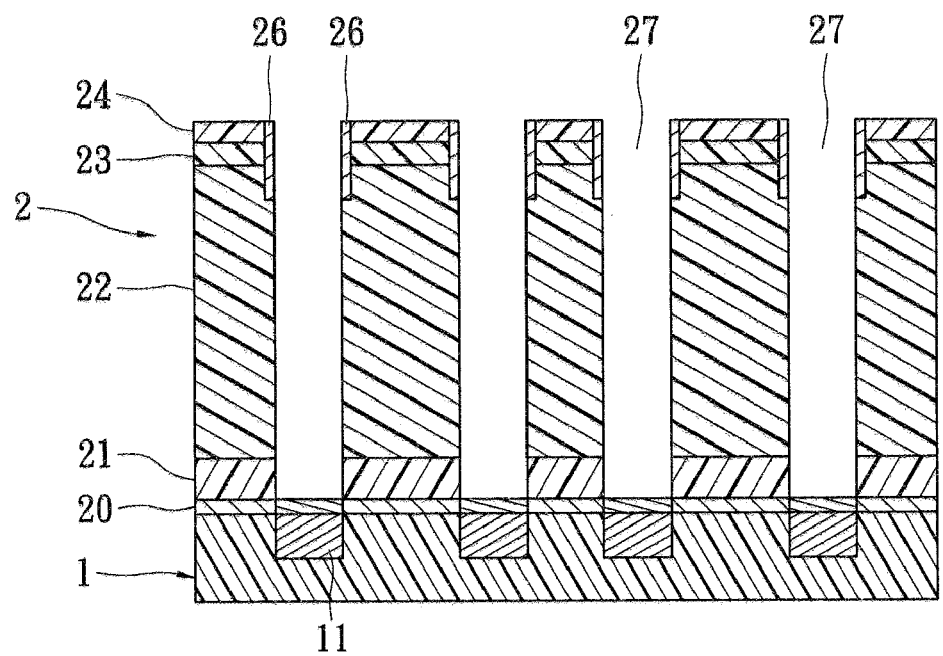
FIG. 10 is a fifth cross-sectional view showing a step of the method for manufacturing capacitor lower electrodes of a semiconductor memory of the present invention.

Please refer to FIG. 9 and FIG. 10, the fourth process step is as follows: firstly partially etching the second silicon nitride layer 26 and the hard mask layer 24 (as shown in FIG. 9) and then etching the second silicon nitride layer 26, the dielectric layer 22, the dielectric layer 21 and the insulating nitride layer 20 under the concave portions 25 to form a plurality of spaced trenches 27 (as shown in FIG. 10, the step is called as 42 etch) for the exposure of the conductive plugs 11.

Figure 11:
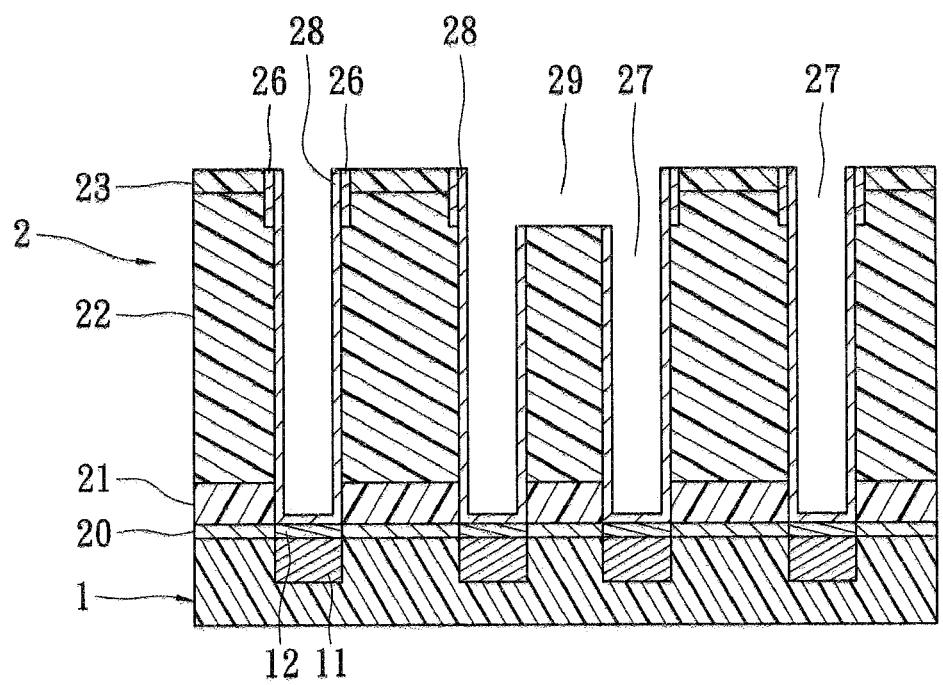
FIG. 11 is a sixth cross-sectional view showing a step of the method for manufacturing capacitor lower electrodes of a semiconductor memory of the present invention.

Please refer to FIG. 11, the fourth process step is as follows: forming a conductive metal material 12 and a capacitor lower electrode 28 within each trench 27 successively (the step is called as 42 capacitor), and partially etching the first silicon nitride layer 23, the second silicon nitride layer 26, the dielectric layer 22 and the capacitor lower electrodes 28 to form an etching area 29 (the step is called as 25 Lattice etch). The conductive metal materials 12 are titanium metal materials which are deposited onto and connected with the conductive plugs 11. The capacitor lower electrodes 28, being as a cylindrical structure with a U-shaped cross-section, are composed of titanium or titanium nitride. The capacitor lower electrodes 28 are attached to the walls of the trenches 27, and the bottoms of the capacitor lower electrodes 28 are electrically connected with the upper surfaces of the conductive metal materials 12. Before the etching area 29 is formed, the step further includes grinding and removing the hard mask layer 24 and the certain portions of the second silicon nitride layer 26 in accordance with a chemical mechanical grinding method, so that the upper surface of the stacked structure 2 is flat.

Figure 12:
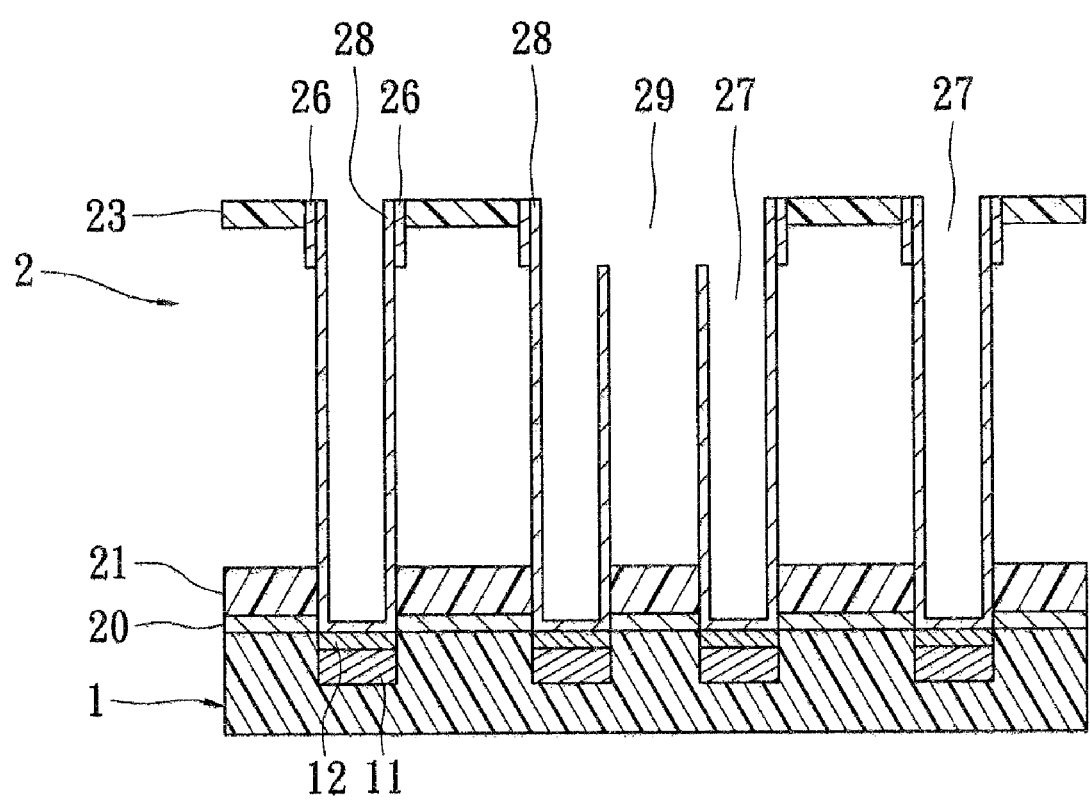
FIG. 12 is a seventh cross-sectional view showing a step of the method for manufacturing capacitor lower electrodes of a semiconductor memory of the present invention.

Please refer to FIG. 12, the fifth process step is as follows: etching and removing the dielectric layer 22 from the etching area 29. So the periphery of each capacitor lower electrode 28 according to the present invention is surrounded and attached to by the second silicon nitride layer 26 deeper than the first silicon nitride layer 23, and the second silicon nitride layer 26 has a larger surface area, thereby increasing the contact area between the second silicon nitride layer 26 and the capacitor lower electrodes 28 and enhancing the supporting stress of the capacitor lower electrodes 28.

The periphery of each capacitor lower electrode 28 associated with the present invention is surrounded and attached to by the second silicon nitride layer 26 deeper than the first silicon nitride layer 23, and the second silicon nitride layer 26 has a larger surface area, thereby increasing the contact area between the second silicon nitride layer 26 and the capacitor lower electrodes 28, enhancing the supporting stress of the capacitor lower electrodes 28, reducing the difficulty in disposing of capacitor dielectric layers and capacitor upper electrodes outside the capacitor lower electrodes 28, and effectively preventing the capacitor lower electrodes 28 from collapsing or producing deformation.

What are disclosed above are only the specification and the drawings of the preferred embodiment of the present invention and it is therefore not intended that the present invention be limited to the particular embodiment disclosed. It will be understood by those skilled in the art that various equivalent changes may be made depending on the specification and the drawings of the present invention without departing from the scope of the present invention.

What is claimed is:

1. A method for manufacturing capacitor lower electrodes of a semiconductor memory, particularly a method for manufacturing a stack dynamic random access memory, comprising the steps of:

forming a stacked structure over a semiconductor substrate with a plurality of conductive plugs;

partially etching a hard mask layer, a first silicon nitride layer and a dielectric layer in the stacked structure to form a plurality of concave portions;

depositing a second silicon nitride layer onto the hard mask layer and into the concave portions;

partially etching the second silicon nitride layer, the hard mask layer, the dielectric layer and an insulating nitride layer to form a plurality of trenches to expose the conductive plugs;

in each of the plurality of trenches, forming a conductive metal material on the exposed conductive plug and a capacitor lower electrode electrically connecting the conductive metal material, and partially etching the first silicon nitride layer, the second silicon nitride layer, the dielectric layer and the capacitor lower electrodes to form an etching area; and etching and removing the dielectric layer from the etching area so that a periphery portion of each of the capacitor lower electrodes is surrounded by and attached to the second silicon nitride layer for enhancing supporting strength of the capacitor lower electrodes, reducing the difficulty in disposing of capacitor dielectric layers and capacitor upper electrodes outside the capacitor lower electrodes, and preventing the capacitor lower electrodes from collapsing or producing deformation.

2. The method as claimed in claim 1, wherein the step of forming the stacked structure is stacking an insulating nitride layer, at least one dielectric layer, a first silicon nitride layer and a hard mask layer in turn, the insulating nitride layer located over the semiconductor substrate, the dielectric layer interposed between the insulating nitride layer and the first silicon nitride layer, and the hard mask layer located on the first silicon nitride layer.

3. The method as claimed in claim 1, wherein in the step of forming the concave portions, the depth of the concave portions is controlled basing on an etching duration.

4. The method as claimed in claim 1, wherein in the step of forming the concave portions, positions of the concave portions are determined basing on a yellow light technology and then the layers are etched to form the concave portions basing on a plasma dry etching technology.

5. The method as claimed in claim 1, wherein in the step of forming the trenches, the second silicon nitride layer and the hard mask layer are firstly partially etched, and then the second silicon nitride layer, the dielectric layer and the insulating nitride layer under the concave portions are etched.

6. The method as claimed in claim 1, further comprising the step of grinding and removing the hard mask layer and certain portions of the second silicon nitride layer by utilizing a chemical mechanical grinding method before the etching area is formed.

7. The method as claimed in claim 1, wherein the hard mask layer is composed of silicon dioxide or silicon nitride, the dielectric layer is composed of silicate glass, and the capacitor lower electrodes are composed of titanium or titanium nitride.

8. A method for manufacturing capacitor lower electrodes of a semiconductor memory, comprising the steps of:

forming a stacked structure comprising a dielectric layer, a first silicon nitride layer, and a hard mask layer, wherein the first silicon nitride layer is interposed between the hard mask layer and the dielectric layer, and the hard mask layer is located on the first silicon nitride layer;

partially etching the hard mask layer, the first silicon nitride layer and the dielectric layer to form a plurality of concave portions;

depositing a second silicon nitride layer onto the hard mask layer and into the concave portions;

partially etching the second silicon nitride layer, the hard mask layer, and the dielectric layer to form a plurality of trenches;

in each of the plurality of trenches, forming a capacitor lower electrode, and partially etching the first silicon nitride layer, the second silicon nitride layer, the dielectric layer and the capacitor lower electrodes to form an etching area; and etching and removing the dielectric layer from the etching area so that a periphery portion of each of the capacitor lower electrodes is surrounded by and attached to the second silicon nitride layer for enhancing supporting strength of the capacitor lower electrodes, reducing the difficulty in disposing of capacitor dielectric layers and top capacitor electrodes outside the capacitor lower electrodes, and preventing the capacitor lower electrodes from collapsing or producing deformation.

9. The method as claimed in claim 8, wherein in the step of forming the concave portions, the depth of the concave portions is controlled basing on an etching duration.

10. The method as claimed in claim 8, wherein in the step of forming the concave portions, positions of the concave portions are determined basing on a yellow light technology and then the layers are etched to form the concave portions basing on a plasma dry etching technology.

11. The method as claimed in claim 8, wherein in the step of forming the trenches, the second silicon nitride layer and the hard mask layer are firstly partially etched, and then the second silicon nitride layer and the dielectric layer under the concave portions are etched.

12. The method as claimed in claim 8, further comprising the step of grinding and removing the hard mask layer and the partial second silicon nitride layer by utilizing a chemical mechanical grinding method before the etching area is formed.

13. The method as claimed in claim 8, wherein the hard mask layer is composed of silicon dioxide or silicon nitride, the dielectric layer is composed of silicate glass, and the capacitor lower electrodes are composed of titanium or titanium nitride.

* * * * *